US012805109B2

(12) United States Patent
Kim et al.

(10) Patent No.: US 12,805,109 B2
(45) Date of Patent: Nov. 17, 2026

(54) SOLAR CELL INCLUDING AN ENCAPSULATION LAYER COMPRISING A DOPED METAL OXIDE OR OXYNITRIDE AND A METHOD FOR MANUFACTURING THE SAME

(71) Applicant: JUSUNG ENGINEERING CO., LTD., Gwangju-si (KR)

(72) Inventors: Jae Ho Kim, Gwangju-si (KR); Chul Joo Hwang, Gwangju-si (KR)

(73) Assignee: JUSUNG ENGINEERING CO., LTD. (KR)

( * ) Notice: Subject to any disclaimer, the term of this patent is extended or adjusted under 35 U.S.C. 154(b) by 429 days.

(21) Appl. No.: 18/566,620

(22) PCT Filed: Jun. 2, 2022

(86) PCT No.: PCT/KR2022/007804
§ 371 (c)(1),
(2) Date: Dec. 1, 2023

(87) PCT Pub. No.: WO2022/255804
PCT Pub. Date: Dec. 8, 2022

(65) Prior Publication Data
US 2025/0098395 A1 Mar. 20, 2025

(30) Foreign Application Priority Data
Jun. 2, 2021 (KR) ........................ 10-2021-0071211

(51) Int. Cl.
*H10K 30/88* (2023.01)
*H10K 30/50* (2023.01)
(Continued)

(52) U.S. Cl.
CPC ............ *H10K 30/88* (2023.02); *H10K 30/50* (2023.02); *H10K 30/57* (2023.02); *H10K 30/80* (2023.02); *H10K 39/12* (2023.02); *H10K 39/18* (2023.02)

(58) Field of Classification Search
CPC ........ H10K 30/88; H10K 30/57; H10K 39/12; H10F 10/19; H10F 19/90
See application file for complete search history.

(56) References Cited

U.S. PATENT DOCUMENTS

2010/0243029 A1* 9/2010 Higashi ............... H10F 77/1699
136/244
2010/0263718 A1* 10/2010 Abiko ..................... H10F 19/85
136/252
(Continued)

FOREIGN PATENT DOCUMENTS

JP 2010238863 A 10/2010
JP 2012004239 A 1/2012
(Continued)

OTHER PUBLICATIONS

International Search Report for PCT/KR2022/007804 mailed Sep. 13, 2022.

*Primary Examiner* — Davienne N Monbleau
*Assistant Examiner* — Dmitri Mihaliov
(74) *Attorney, Agent, or Firm* — Renaissance IP Law Group LLP

(57) ABSTRACT

The present inventive concept provides a solar cell and a method for manufacturing the solar cell. The solar cell comprises a solar cell layer on a substrate and an encapsulation layer provided on the solar cell layer. The encapsulation layer comprises a metal oxide doped with a dopant material or a metal oxynitride doped with a dopant material; and the metal oxide or the metal oxynitride comprises at
(Continued)

least one metal selected from the group consisting of W, Nb, and Sn.

17 Claims, 11 Drawing Sheets

(51) Int. Cl.

| | |
|---|---|
| ***H10K 30/57*** | (2023.01) |
| ***H10K 30/80*** | (2023.01) |
| ***H10K 39/12*** | (2026.01) |
| ***H10K 39/18*** | (2026.01) |

(56) References Cited

U.S. PATENT DOCUMENTS

| | | | | |
|---|---|---|---|---|
| 2012/0160308 | A1* | 6/2012 | Tseng | H10K 30/57 136/255 |
| 2017/0110603 | A1* | 4/2017 | Yang | H10F 77/211 |
| 2017/0309408 | A1* | 10/2017 | Hayakawa | H10K 30/88 |
| 2019/0221690 | A1* | 7/2019 | Bush | H10F 77/247 |
| 2022/0059294 | A1* | 2/2022 | Wang | H01G 9/0036 |
| 2024/0138164 | A1* | 4/2024 | Berry | H10K 30/81 |

FOREIGN PATENT DOCUMENTS

| | | | |
|---|---|---|---|
| JP | 2012178402 | A | 9/2012 |
| KR | 20130056663 | A | 5/2013 |
| KR | 20130110180 | A | 10/2013 |
| KR | 20130125349 | A | 11/2013 |
| KR | 20150121344 | A | 10/2015 |
| KR | 20170070721 | A | 6/2017 |
| KR | 20180105812 | A | 10/2018 |
| KR | 20190026484 | A | 3/2019 |
| WO | 2016039237 | A1 | 3/2016 |
| WO | 2016060154 | A1 | 4/2016 |

* cited by examiner

SOLAR CELL INCLUDING AN ENCAPSULATION LAYER COMPRISING A DOPED METAL OXIDE OR OXYNITRIDE AND A METHOD FOR MANUFACTURING THE SAME

TECHNICAL FIELD

The present inventive concept relates to a solar cell, and more particularly, to an encapsulation layer of a solar cell.

BACKGROUND ART

A perovskite compound has a problem where the perovskite compound is easily oxidized by water. Therefore, a perovskite solar cell where a perovskite compound is applied to an absorption layer of a solar cell has a problem where the absorption layer is oxidized by external oxygen or water, and due to this, the efficiency of a solar cell is reduced.

Therefore, an encapsulation layer for protecting the absorption layer of the solar cell from the penetration of external oxygen or water is needed.

DISCLOSURE

Technical Problem

The present inventive concept is devised to solve the above-described problem and is for providing a solar cell, including an encapsulation layer for efficiently protecting an absorption layer of the solar cell from the penetration of external oxygen or water, and a method of manufacturing the solar cell.

Technical Solution

To accomplish the above-described object, the present inventive concept provides a solar cell including: a solar cell layer provided on a substrate; and an encapsulation layer provided on the solar cell layer, wherein the encapsulation layer includes metal oxide doped with a dopant material or metal oxynitride doped with a dopant material, and the metal oxide or the metal oxynitride includes at least one metal selected from among a group consisting of W, Nb, and Sn.

The encapsulation layer may include a first encapsulation layer contacting the solar cell layer and a second encapsulation layer which is formed on the first encapsulation layer and does not contact the solar cell layer, the metal oxide doped with the dopant material or the metal oxynitride doped with the dopant material may be included in the second encapsulation layer, and the first encapsulation layer may include an insulating material.

The second encapsulation layer may consist of a plurality of layers including different materials.

The dopant material may include a material enabling oxide to be formed in the metal oxide or the metal oxynitride, and a refractive index of oxide of the dopant material may be lower than a refractive index of the metal oxide or a refractive index of the metal oxynitride.

The solar cell layer may include a substrate-type solar cell and a perovskite solar cell.

The present inventive concept provides a solar cell including: a solar cell layer provided on a substrate; and an encapsulation layer provided on the solar cell layer, wherein the solar cell layer includes a plurality of unit cells serially connected with one another, the encapsulation layer includes a first encapsulation layer contacting the solar cell layer and a second encapsulation layer which is formed on the first encapsulation layer and does not contact the solar cell layer, and the first encapsulation layer and the second encapsulation layer are provided to fill a region between two adjacent unit cells.

The solar cell layer may include a plurality of first electrodes spaced apart from each other with a first separation portion therebetween, a plurality of perovskite solar cells provided on the plurality of first electrodes and spaced apart from each other with a contact portion and a second separation portion therebetween, and a plurality of second electrodes provided on the plurality of perovskite solar cells and connected with the first electrode through the contact portion, and the first encapsulation layer and the second encapsulation layer may be provided to fill an inner portion of the second separation portion.

The solar cell layer may include a substrate-type solar cell, a perovskite solar cell provided on the substrate-type solar cell, a first electrode provided on a lower surface of the substrate-type solar cell, a second electrode provided on an upper surface of the perovskite solar cell, and a connection line connecting the first electrode of one unit cell with the second electrode of one other unit cell, and the first encapsulation layer and the second encapsulation layer may contact the connection line.

The solar cell layer may include a perovskite solar cell including a contact portion, a buffer layer which is provided on the perovskite solar cell and includes a film including a plurality of holes and a conductive layer filled into the plurality of holes, a substrate-type solar cell provided on the buffer layer, an electrode provided on the substrate-type solar cell, and a connection line serially connecting one unit cell with one other unit cell through the contact portion, and the first encapsulation layer and the second encapsulation layer may be provided to fill the contact portion.

The solar cell may further include a barrier layer provided between the substrate and the solar cell layer, and the encapsulation layer may be provided to cover an edge region of the barrier layer which is not covered by the solar cell layer and is exposed.

The solar cell may further include a barrier layer provided between the substrate and the solar cell layer, and the encapsulation layer may be provided to cover an edge region of the barrier layer which is not covered by the solar cell layer and is exposed.

A protection layer may be further provided on the encapsulation layer.

The present inventive concept also provides a method of manufacturing a solar cell, the method including: a process of forming a solar cell layer on a substrate; a process of forming an encapsulation layer on the solar cell layer; and a process of forming a protection layer on the encapsulation layer, wherein the encapsulation layer includes metal oxide doped with a dopant material or metal oxynitride doped with a dopant material, and the metal oxide or the metal oxynitride includes at least one metal selected from among a group consisting of W, Nb, and Sn.

The present inventive concept also provides a method of manufacturing a solar cell, the method including: a process of forming a solar cell layer on a substrate; a process of forming an encapsulation layer on one surface of a protection layer; and a process of stacking the encapsulation layer and the protection layer on one surface of the solar cell layer through application of pressure so that the encapsulation layer contacts the solar cell layer, wherein the encapsulation layer includes metal oxide doped with a dopant material or metal oxynitride doped with a dopant material, and the metal oxide or the metal oxynitride includes at least one metal selected from among a group consisting of W, Nb, and Sn.

The encapsulation layer may include a first encapsulation layer contacting the solar cell layer and a second encapsulation layer which is formed on the first encapsulation layer and does not contact the solar cell layer, the metal oxide doped with the dopant material or the metal oxynitride doped with the dopant material may be included in the second encapsulation layer, and the first encapsulation layer may include an insulating material.

The dopant material may include a material enabling oxide to be formed in the metal oxide or the metal oxynitride, and a refractive index of oxide of the dopant material may be lower than a refractive index of the metal oxide or a refractive index of the metal oxynitride.

Advantageous Effect

According to the present inventive concept, the following effects may be realized.

According to an embodiment of the present inventive concept, an encapsulation layer may include metal oxide doped with a dopant material or metal oxynitride doped with a dopant material, and the metal oxide the metal oxynitride may include at least one metal selected from among the group consisting of tungsten (W), niobium (Nb), and tin (Sn), thereby preventing a reduction in light transmittance caused by the encapsulation layer and efficiently preventing external oxygen or water from penetrating into a solar cell.

According to an embodiment of the present inventive concept, an encapsulation layer may include a first encapsulation layer which contacts a solar cell layer and a second encapsulation layer which is provided on the first encapsulation layer without contacting the solar cell layer, and the first encapsulation layer and the second encapsulation layer may be provided to fill a region between two adjacent unit cells, thereby efficiently preventing the penetration of external oxygen or water through a region between unit cells.

According to another embodiment of the present inventive concept, because an encapsulation layer is deposited on an upper surface of a protection layer without being directly deposited on an upper surface of a solar cell layer and then is deposited on the upper surface of the solar cell layer, there is no possibility that the solar cell layer is damaged in performing a deposition process of the encapsulation layer, and thus, there is an advantage where the deposition process of the encapsulation layer may be performed within a high temperature range, thereby forming an encapsulation layer having denser film quality.

MODE FOR INVENTIVE CONCEPT

Figure 1:
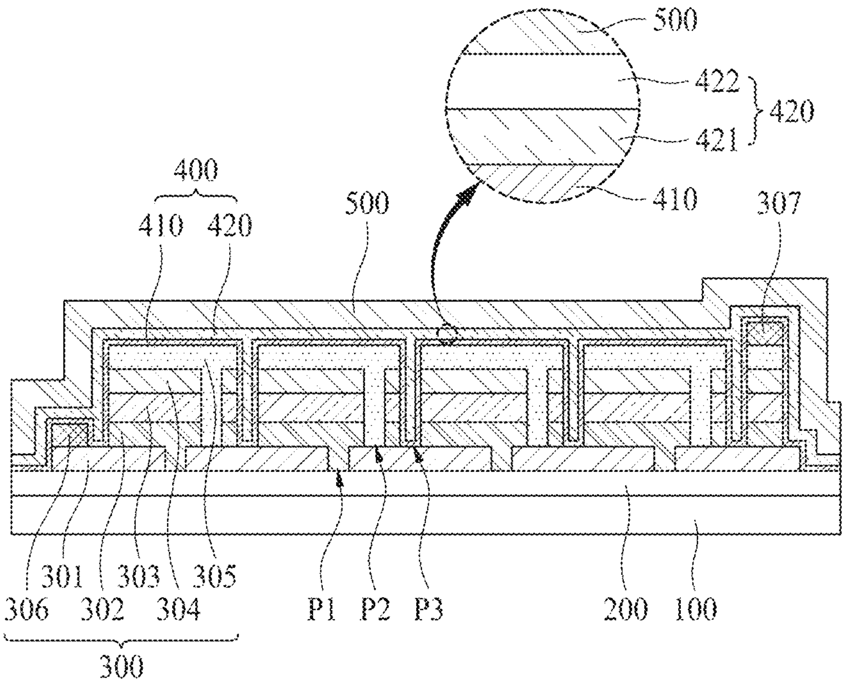
FIG. 1 is a schematic cross-sectional view of a solar cell according to an embodiment of the present inventive concept.

Advantages and features of the present inventive concept, and implementation methods thereof will be clarified through following embodiments described with reference to the accompanying drawings. The present inventive concept may, however, be embodied in different forms and should not be construed as limited to the embodiments set forth herein. Rather, these embodiments are provided so that this inventive concept will be thorough and complete, and will fully convey the scope of the present inventive concept to those skilled in the art. Furthermore, the present inventive concept is only defined by scopes of claims.

A shape, a size, a ratio, an angle, and a number disclosed in the drawings for describing embodiments of the present inventive concept are merely an example, and thus, the present inventive concept is not limited to the illustrated details. Like reference numerals refer to like elements throughout. In the following description, when the detailed description of the relevant known technology is determined to unnecessarily obscure the important point of the present inventive concept, the detailed description will be omitted. In a case where ‘comprise’, ‘have’, and ‘include’ described in the present specification are used, another part may be added unless ‘only~’ is used. The terms of a singular form may include plural forms unless referred to the contrary.

In construing an element, the element is construed as including an error range although there is no explicit description.

In describing a position relationship, for example, when a position relation between two parts is described as ‘on~’, ‘over~’, ‘under~’, and ‘next~’, one or more other parts may be disposed between the two parts unless ‘just’ or ‘direct’ is used.

In describing a time relationship, for example, when the temporal order is described as ‘after~’, ‘subsequent~’, ‘next~’, and ‘before~’, a case which is not continuous may be included unless ‘just’ or ‘direct’ is used.

It will be understood that, although the terms “first”, “second”, etc. may be used herein to describe various elements, these elements should not be limited by these terms. These terms are only used to distinguish one element from another. For example, a first element could be termed a second element, and, similarly, a second element could be termed a first element, without departing from the scope of the present inventive concept.

Features of various embodiments of the present inventive concept may be partially or overall coupled to or combined with each other, and may be variously inter-operated with each other and driven technically as those skilled in the art can sufficiently understand. The embodiments of the present inventive concept may be carried out independently from each other, or may be carried out together in co-dependent relationship.

Hereinafter, preferable embodiments of the present inventive concept will be described in detail with reference to the accompanying drawings.

FIG. 1 is a schematic cross-sectional view of a solar cell according to an embodiment of the present inventive concept.

As seen in FIG. 1, the solar cell according to an embodiment of the present inventive concept includes a substrate 100, a barrier layer 200, a solar cell layer 300, an encapsulation layer 400, and a protection layer 500.

The substrate 100 may include a rigid material, or may include a flexible material. For example, the substrate 100 may include glass or plastic.

The barrier layer 200 is formed on one surface (for example, an upper surface) of the substrate 100. The barrier layer 200 prevents a material included in the substrate 100 from being diffused to the solar cell layer 300, and moreover, prevents external oxygen or water from penetrating into the solar cell layer 300 through the substrate 100. The barrier layer 200 may be entirely formed on an upper surface of the substrate 100.

The barrier layer 200 may include metal oxide, such as silicon oxide, silicon nitride, or aluminum, and an inorganic insulating material such as meta nitride such as aluminum and may be formed through a thin film deposition process such as a chemical vapor deposition (CVD) process or an atomic layer deposition (ALD) process. The barrier layer 200 may be omitted.

The solar cell layer 300 is formed on one surface (for example, an upper surface) of the barrier layer 200.

The solar cell layer 300 includes a first electrode 301, a first conductive charge transport layer 302, a light absorption layer 303, a second conductive charge transport layer 304, a second electrode 305, a first terminal 306, and a second terminal 307. A perovskite solar cell is configured by a combination of the first conductive charge transport layer 302, the light absorption layer 303, and the second conductive charge transport layer 304.

The first electrode 301 is formed on the one surface (for example, the upper surface) of the barrier layer 200. The first electrode 301 may include a transparent conductive material such as metal oxide. A plurality of first electrodes 301 are spaced apart from each other with a first separation portion P1 therebetween. Also, the first electrode 301 may not be provided at both edges of the barrier layer 200. That is, an end of the first electrode 301 disposed at an outermost portion may be disposed more inward than an end of the barrier layer 200, and thus, an electrical connection between the element of the solar cell and other external element may be blocked. The first electrode 301 may not be provided in the first separation portion P1, and thus, the upper surface of the barrier layer 200 may be exposed.

The first conductive charge transport layer 302 is formed on one surface (for example, an upper surface) of the first electrode 301. The first conductive charge transport layer 302 may be formed to fill the first separation portion P1, and a lower surface of the first conductive charge transport layer 302 may contact the upper surface of the barrier layer 200. Also, a plurality of first conductive charge transport layers 302 may be spaced apart from each other with a contact portion P2 and a second separation portion P3 therebetween. An end of the first conductive charge transport layer 302 disposed at an outermost portion may be disposed more inward than an end of the first electrode 301 disposed at an outermost portion, and thus, the end of the first electrode 301 disposed at the outermost portion may be exposed at the outside.

The light absorption layer 303 is formed on one surface (or an upper surface) of the first conductive charge transport layer 302. A plurality of light absorption layers 303 may be spaced apart from each other with the contact portion P2 and the second separation portion P3 therebetween. An end of the light absorption layer 303 disposed at an outermost portion may be patterned and formed to match the end of the first conductive charge transport layer 302 disposed at the outermost portion. Accordingly, the end of the light absorption layer 303 disposed at the outermost portion may be disposed more inward than the end of the first electrode 301 disposed at the outermost portion, and thus, the end of the first electrode 301 disposed at the outermost portion may be exposed at the outside. The light absorption layer 303 includes a perovskite compound known to those skilled in the art.

The second conductive charge transport layer 304 is formed on the one surface (for example, the upper surface) of the light absorption layer 303. A plurality of second conductive charge transport layers 304 may be spaced apart from each other with the contact portion P2 and the second separation portion P3 therebetween. An end of the second conductive charge transport layer 304 disposed at an outermost portion may be patterned and formed to match the end of the light absorption layer 303 disposed at the outermost portion. Accordingly, the end of the second conductive charge transport layer 304 disposed at the outermost portion may be disposed more inward than the end of the first electrode 301 disposed at the outermost portion, and thus, the end of the first electrode 301 disposed at the outermost portion may be exposed at the outside.

In a case where the first conductive charge transport layer 302 is provided as an electron transport layer, the second conductive charge transport layer 304 is provided as a hole transport layer, and in a case where the first conductive charge transport layer 302 is provided as a hole transport layer, the second conductive charge transport layer 304 is provided as an electron transport layer.

The electron transport layer may include various N-type organic materials such as bathocuproine (BCP), C60, or phenyl-C61-butyric acid methyl ester (PCBM) known to those skilled in the art, various N-type metal oxides such as zinc oxide (ZnO), c-$TiO_2$/mp-$TiO_2$, tin dioxide ($SnO_2$), or indium zinc oxide (IZO) known to those skilled in the art, and other various N-type organic or inorganic materials known to those skilled in the art.

The hole transport layer may include various P-type organic materials such as Spiro-MeO-TAD, Spiro-TTB, polyaniline, polyphenol, poly(3,4-ethylenedioxythiophene)-poly(styrenesulfonate) (PEDOT-PSS), poly[bis(4-phenyl)(2,4,6-trimethylphenyl)amine] (PTAA), and poly(3-hexylthiophene-2,5-diyl) (P3HT) known to those skilled in the art, various P-type metal oxides such as Ni oxide, Mo oxide, V oxide, W oxide, or Cu oxide known to those skilled in the art, and other various P-type organic or inorganic materials known to those skilled in the art.

The second electrode 305 is formed on one surface (for example, an upper surface) of the second conductive charge transport layer 304. A plurality of second electrodes 305 may be spaced apart from each other with the second separation portion P3 therebetween. A unit cell may be configured by a stack structure of the first electrode 301, the first conductive charge transport layer 302, the light absorption layer 303, the second conductive charge transport layer 304, and the second electrode 305, and in this case, the second electrode 305 of one unit cell may be connected with, through the contact portion P2, the first electrode 301 of another unit cell adjacent thereto, whereby a plurality of unit cells may be serially connected with one another. The second electrode 305 may include a metal material, but is not limited thereto.

An end of the second electrode 305 disposed at an outermost portion may be patterned and formed to match the end of the second conductive charge transport layer 304 disposed at the outermost portion. Accordingly, the end of the second electrode 305 disposed at the outermost portion may be disposed more inward than the end of the first electrode 301 disposed at the outermost portion, and thus, the end of the first electrode 301 disposed at the outermost portion may be exposed at the outside.

The first terminal 306 may be formed on one side (for example, the upper surface of the first electrode 301 of a unit cell disposed at a left outermost portion), and the second terminal 307 may be formed on the other side (for example, the upper surface of the second electrode 305 of a unit cell disposed at a right outermost portion).

For example, the first terminal 306 may function as a negative (−) terminal of each of a plurality of unit cells serially connected with one another, and the second terminal 307 may function as a positive (+) terminal of each of a plurality of unit cells serially connected with one another.

The encapsulation layer 400 is formed on one surface (for example, an upper surface) of the solar cell layer 300. The encapsulation layer 400 may prevent external water or oxygen from penetrating into the solar cell layer 300. Accordingly, the encapsulation layer 400 is formed to entirely cover the upper surface of the solar cell layer 300, and moreover, is also formed to cover upper surfaces of both edges of the barrier layer 200 exposed at the outside.

The encapsulation layer 400 may be formed to cover a side surface of a unit cell, and thus, may prevent external water or oxygen from penetrating into the unit cell through the side surface of the unit cell. In detail, the encapsulation layer 400 may be formed to cover a side surface of an outermost unit cell and fill an inner portion of the second separation portion P3 provided in a region between two adjacent unit cells, and thus, may be formed to cover side surfaces of all unit cells. Also, the encapsulation layer 400 covers an upper surface and a side surface of an exposed first electrode 301 of the outermost unit cell and covers upper surfaces and side surfaces of the first terminal 306 and the second terminal 307.

The encapsulation layer 400 may include a first encapsulation layer 410 and a second encapsulation layer 420. The first encapsulation layer 410 may be formed to contact the solar cell layer 300, on the solar cell layer 300, and the second encapsulation layer 420 may be formed on the first encapsulation layer 410 and may not contact the solar cell layer 300.

The first encapsulation layer 410 and the second encapsulation layer 420 are formed to cover a side surface of the outermost unit cell and fill an inner portion of the second separation portion P3 provided in a region between two adjacent unit cells, cover the upper surface and the side surface of the exposed first electrode 301 of the outermost unit cell, cover the upper surfaces and the side surfaces of the first terminal 306 and the second terminal 307, and cover an upper surface of the exposed barrier layer 200.

In this case, in each of a plurality of unit cells, the first encapsulation layer 410 may contact a side surface and an upper surface of the first electrode 301, a side surface of the first conductive charge transport layer 302, a side surface of the light absorption layer 303, a side surface of the second conductive charge transport layer 304, and a side surface and an upper surface of the second electrode 305, and moreover, may contact a side surface and an upper surface of the first terminal 306 and a side surface and an upper surface of the second terminal 307 and may also contact the upper surface of the barrier layer 200. The first encapsulation layer 410 may include an insulating material such as silicon oxide or silicon nitride, and thus, may insulate side surfaces of each unit cell from each other. The first encapsulation layer 410 may be formed through a thin film deposition process such as a chemical vapor deposition (CVD) process or an atomic layer deposition (ALD) process.

Because the second encapsulation layer 420 does not contact the solar cell layer 300, even when the second encapsulation layer 420 uses a material having conductivity, there is no problem where short circuit occurs in the side surface of each unit cell, and thus, a material of the second encapsulation layer 420 may use an optimal material capable of preventing the penetration of water or oxygen.

The second encapsulation layer 420 may include metal oxide or metal oxynitride. The metal oxide may include at least one metal oxide selected from among the group consisting of tungsten (W), niobium (Nb), and tin (Sn), and the metal oxynitride may include at least one metal oxynitride selected from among the group consisting of W, Nb, and Sn. For example, the metal oxide may be selected from among the group consisting of $WO_3$, NbO, and $SnO_2$. Also, the metal oxynitride may be selected from among the group consisting of WOxNy, NbOxNy, and SnOxNy. The x and the y may each be greater than 0.

The second encapsulation layer 420 may include metal oxide doped with a dopant material or metal oxynitride doped with a dopant material. As described above, when the second encapsulation layer 420 further includes a dopant material, a light transmittance may be enhanced, and thus, the efficiency of a solar cell may be enhanced. The dopant material may include a material which enables oxide to be formed in the metal oxide or the metal oxynitride. In this case, because a light transmittance of the second encapsulation layer 420 may be enhanced, it is preferable that a refractive index of oxide of the dopant material is lower than a refractive index of the metal oxide or a refractive index of the metal oxynitride. When a refractive index of an arbitrary material is low, reflection may be reduced, and thus, a light transmittance may be enhanced. Examples of the dopant material may include silicon (Si) or aluminum (Al).

The second encapsulation layer 420 may consist of a plurality of layers which includes a first layer 421 and a second layer 422 including different materials. The second encapsulation layer 420 may be formed through a thin film deposition process such as a chemical vapor deposition (CVD) process or an atomic layer deposition (ALD) process, and in this case, oxygen or ozone plasma processing may be performed while supplying each source material into a chamber.

The protection layer 500 is formed on one surface (for example, an upper surface) of the encapsulation layer 400. The protection layer 500 may be formed to entirely cover the upper surface of the encapsulation layer 400. The protection layer 500 may include glass or plastic.

Figure 2A:
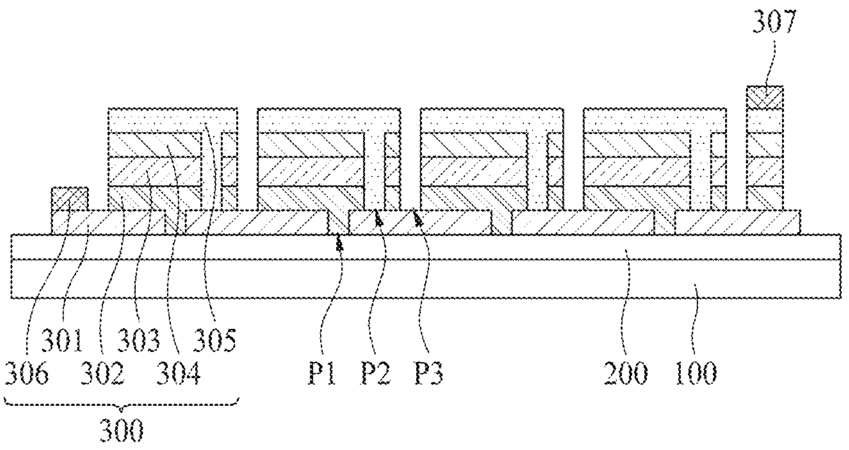
FIGS. 2A to 2C are diagrams of a manufacturing process of a solar cell according to an embodiment of the present inventive concept and relate to a manufacturing method of the solar cell according to FIG. 1 described above.
Figure 2B:
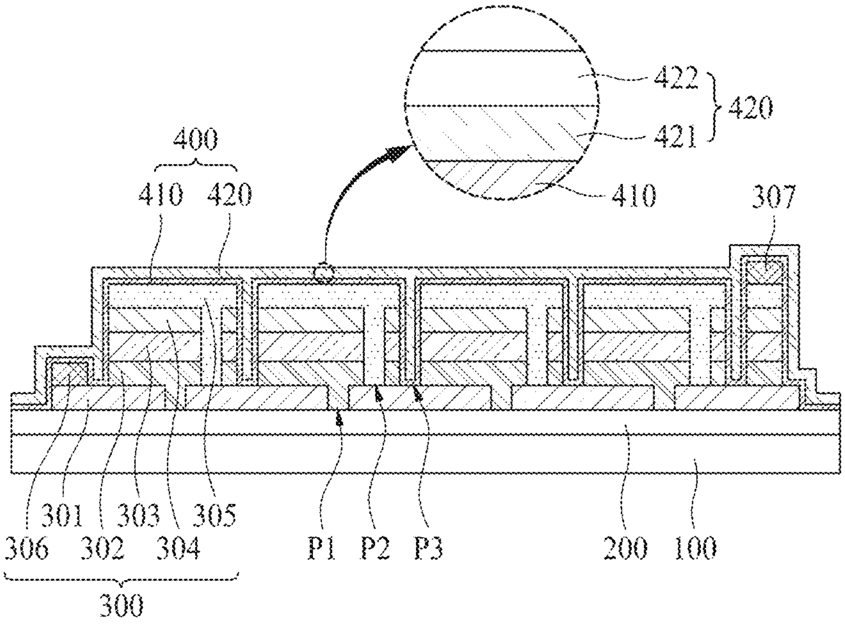
Figure 2C:
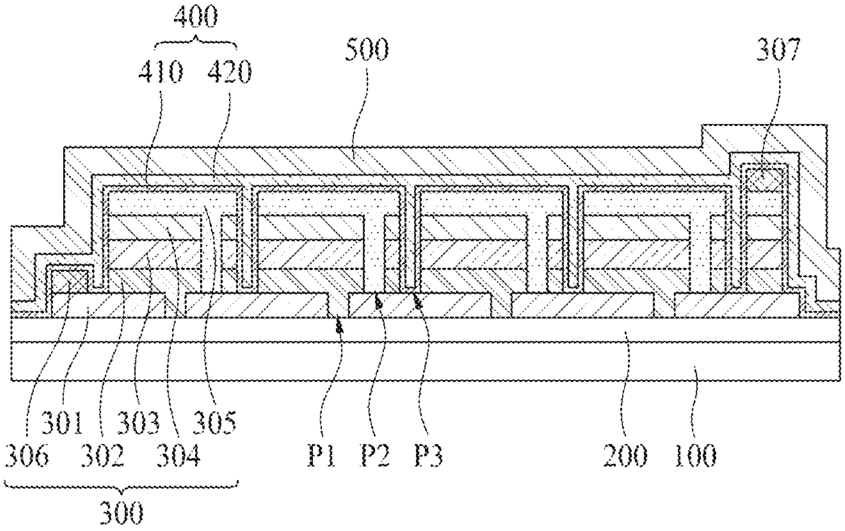

FIGS. 2A to 2C are diagrams of a manufacturing process of a solar cell according to an embodiment of the present inventive concept and relate to a manufacturing method of the solar cell according to FIG. 1 described above. Therefore, a repeated description of the same element is omitted.

First, as seen in FIG. 2A, a barrier layer 200 is formed on one surface (for example, an upper surface) of a substrate 100, and a solar cell layer 300 is formed on one surface (for example, an upper surface) of the barrier layer 200.

The solar cell layer 300 may be obtained through a process which forms a thin film layer for a first electrode 301 on the one surface of the barrier layer 200 and then removes a certain region of the thin film layer through a laser scribing process to form a first separation portion P1 and thus forms a plurality of first electrodes 301, and subsequently, sequentially forms a first conductive charge transport layer 302, a light absorption layer 303, and a second conductive charge transport layer 304 on the first electrode 301 and then removes a certain region of each of the first conductive charge transport layer 302, the light absorption layer 303, and the second conductive charge transport layer 304 through a laser scribing process to form a contact portion P2, and subsequently, forms a thin film layer for a second electrode 305 on the second conductive charge transport layer 304 and then removes a certain region of the thin film layer through a laser scribing process to form a second separation portion P3 and thus forms the second electrode 305 connected with the first electrode 301 through the contact portion P2, and subsequently, forms a first terminal 306 on a first electrode 301 of one outermost portion and forms a second terminal 307 on a second electrode 305 of the other outermost portion.

In this case, the first conductive charge transport layer 302, the light absorption layer 303, and the second conductive charge transport layer 304 may be formed by a deposition process, or may be formed by a coating process.

Subsequently, as seen in FIG. 2B, an encapsulation layer 400 including a first encapsulation layer 410 and a second encapsulation layer 420 is formed on one surface (for example, an upper surface) of the solar cell layer 300.

Detailed configurations of the first encapsulation layer 410 and the second encapsulation layer 420 are the same as FIG. 1, and thus, repeated descriptions thereof are omitted.

Subsequently, as seen in FIG. 2C, a protection layer 500 is formed on one surface (for example, an upper surface) of the encapsulation layer 400.

Figure 3A:
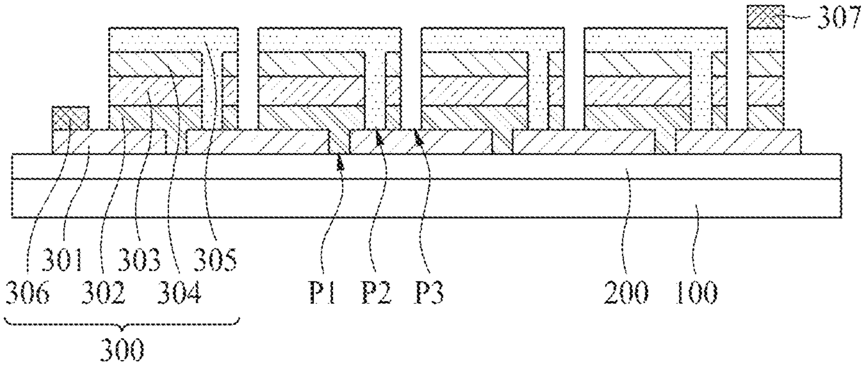
FIGS. 3A to 3C are diagrams of a manufacturing process of a solar cell according to another embodiment of the present inventive concept and relate to the manufacturing method of the solar cell according to FIG. 1 described above.
Figure 3B:
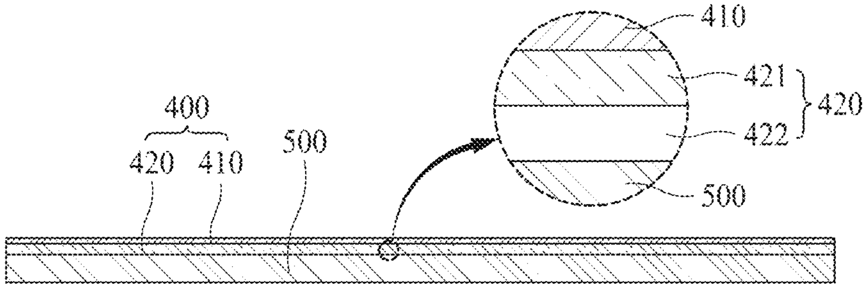
Figure 3C:
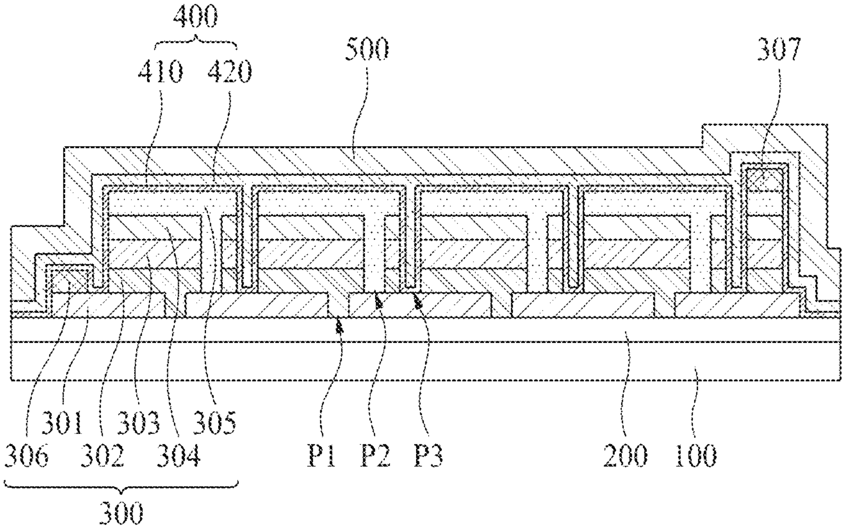

FIGS. 3A to 3C are diagrams of a manufacturing process of a solar cell according to another embodiment of the present inventive concept and relate to the manufacturing method of the solar cell according to FIG. 1 described above. Therefore, a repeated description of the same element is omitted.

First, as seen in FIG. 3A, a barrier layer 200 is formed on one surface (for example, an upper surface) of a substrate 100, and a solar cell layer 300 is formed on one surface (for example, an upper surface) of the barrier layer 200.

A process of FIG. 3A is the same as a process of FIG. 2A described above, and thus, repeated descriptions thereof are omitted.

Subsequently, as seen in FIG. 3B, a second encapsulation layer 420 is formed on one surface of the protection layer 500, and a first encapsulation layer 410 is formed on one surface of the second encapsulation layer 420, thereby forming the encapsulation layer 400 on the one surface of the protection layer 500.

Subsequently, as seen in FIG. 3C, the encapsulation layer 400 and the protection layer 500 are stacked on an upper surface of the solar cell layer 300 through the application of pressure so that the first encapsulation layer 410 contacts the solar cell layer 300, and thus, the solar cell illustrated in FIG. 1 is finished.

In the method according to FIGS. 2A to 2C described above, because the encapsulation layer 400 is directly deposited and formed on the upper surface of the solar cell layer 300, it may be preferable that a deposition process of the encapsulation layer 400 is performed within a low temperature range of 80° C. to 150° C., so as to prevent the damage of the solar cell layer 300 in performing the deposition process of the encapsulation layer 400.

On the other hand, in the method according to FIGS. 3A to 3C described above, because the encapsulation layer 400 is not directly deposited on the upper surface of the solar cell layer 300 and is deposited on the upper surface of the protection layer 500, there is no possibility that the solar cell layer 300 is damaged in performing the deposition process of the encapsulation layer 400, and thus, there may be an advantage where the deposition process of the encapsulation layer 400 may be performed within a high temperature range (for example, a range of 150° C. to 250° C.), thereby forming the encapsulation layer 400 having denser film quality.

Figure 4:
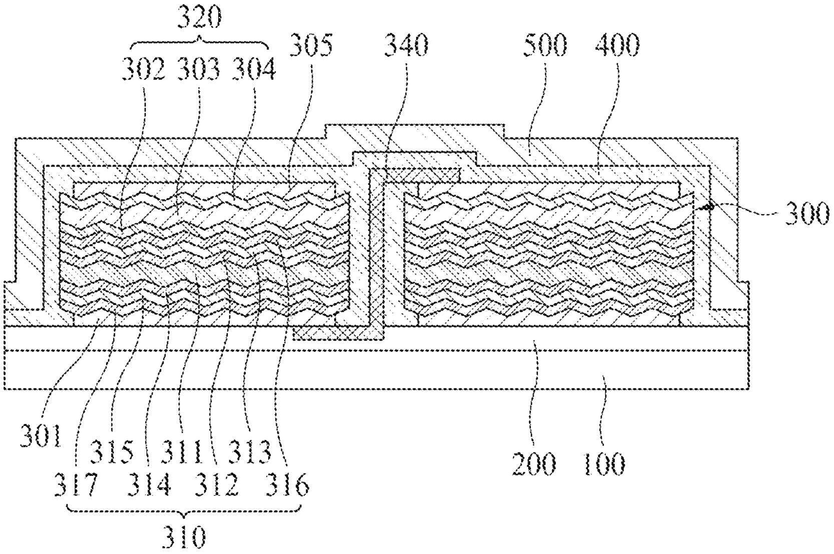
FIG. 4 is a schematic cross-sectional view of a solar cell according to another embodiment of the present inventive concept.

FIG. 4 is a schematic cross-sectional view of a solar cell according to another embodiment of the present inventive concept.

As seen in FIG. 4, the solar cell according to another embodiment of the present inventive concept includes a substrate 100, a barrier layer 200, a solar cell layer 300, an encapsulation layer 400, and a protection layer 500.

The substrate 100 and the barrier layer 200 are as described above, and thus, repeated descriptions thereof are omitted.

The solar cell layer 300 includes a substrate-type solar cell 310, a perovskite solar cell 320, a first electrode 301, a second electrode 305, and a connection line 340.

The substrate-type solar cell 310 includes a semiconductor substrate 311, a first semiconductor layer 312, a second semiconductor layer 313, a third semiconductor layer 314, a fourth semiconductor layer 315, a first transparent electrode layer 316, and a second transparent electrode layer 317.

The semiconductor substrate 311 may consist of an N-type semiconductor wafer. One surface and the other surface (in detail, an upper surface and a lower surface) of the semiconductor substrate 311 may be formed in a concave-concave structure. Therefore, a plurality of layers stacked on the one surface of the semiconductor substrate 311 and a plurality of layers stacked on the other surface of the semiconductor substrate 311 may be stacked in a concave-convex structure corresponding to the concave-convex structure of the semiconductor substrate 311. However, it is possible that a concave-convex structure is formed on only one of the one surface and the other surface of the semiconductor substrate 311, and a concave-convex structure may not be formed on all of the one surface and the other surface of the semiconductor substrate 311.

The first semiconductor layer 312 is formed on one surface (for example, an upper surface) of the semiconductor substrate 311. The first semiconductor layer 312 may be formed through a thin film deposition process such as a chemical vapor deposition (CVD) process or an atomic layer deposition (ALD) process and may consist of an intrinsic semiconductor layer (for example, an intrinsic amorphous silicon layer). However, depending on the case, the first semiconductor layer 312 may consist of a semiconductor layer doped with a small amount of dopant (for example, a small amount of n-type dopant), and for example, may consist of an amorphous silicon layer doped with a small amount of n-type dopant.

The second semiconductor layer 313 is formed on one surface (for example, an upper surface) of the first semiconductor layer 312. The second semiconductor layer 313 may be formed through a thin film deposition process and may consist of, for example, an n-type semiconductor layer having the same polarity as that of the semiconductor substrate 311 or the first semiconductor layer 312. The second semiconductor layer 313 may consist of an n-type amorphous silicon layer.

The third semiconductor layer 314 is formed on the other surface (for example, a lower surface) of the semiconductor substrate 311. The third semiconductor layer 314 may be formed through a thin film deposition process and may consist of an intrinsic semiconductor layer (for example, an intrinsic amorphous silicon layer). However, depending on the case, the third semiconductor layer 314 may consist of an amorphous silicon layer doped with a small amount of dopant (for example, a small amount of p-type dopant). In this case, a polarity of a dopant doped on the third semiconductor layer 314 is opposite to that of a dopant doped on the first semiconductor layer 312.

The fourth semiconductor layer 315 is formed on the other surface (for example, a lower surface) of the third semiconductor layer 314. The fourth semiconductor layer 315 may be formed through a thin film deposition process and may consist of a semiconductor layer doped with a certain dopant. In this case, a polarity of a dopant doped on the fourth semiconductor layer 315 is opposite to that of a dopant doped on the second semiconductor layer 313. The fourth semiconductor layer 315 may consist of a p-type amorphous silicon layer.

The first transparent electrode layer 316 is formed on one surface (for example, an upper surface) of the second semiconductor layer 313. The first transparent electrode layer 316 is formed through a thin film deposition process such as a chemical vapor deposition (CVD) process or an atomic layer deposition (ALD) process. In this case, the first transparent electrode layer 316 may function as a buffer layer between the substrate-type solar cell 310 and the perovskite solar cell 320, and thus, a separate buffer layer is not needed between the substrate-type solar cell 310 and the perovskite solar cell 320. However, although not shown, it is possible that a separate buffer layer is not added between the substrate-type solar cell 310 and the perovskite solar cell 320.

The second transparent electrode layer 317 is formed on the other surface (for example, a lower surface) of the fourth semiconductor layer 315. The second transparent electrode layer 317 may be formed through a thin film deposition process such as a chemical vapor deposition (CVD) process or an atomic layer deposition (ALD) process.

The perovskite solar cell 320 includes a first conductive charge transport layer 302, a light absorption layer 303, and a second conductive charge transport layer 304.

Detailed configurations of the first conductive charge transport layer 302, the light absorption layer 303, and the second conductive charge transport layer 304 are as described above, and thus, repeated descriptions thereof are omitted.

The first electrode 301 is formed on the other surface (for example, a lower surface) of the second transparent electrode layer 317 of the substrate-type solar cell 310, and the second electrode 305 is formed on one surface (for example, an upper surface) of the second conductive charge transport layer 304 of the perovskite solar cell 320. The first electrode 301 and the second electrode 305 may be formed with a certain pattern so that sunlight is incident on an inner portion of a solar cell.

A unit cell of the solar cell according to FIG. 4 is configured by a combination of the substrate-type solar cell 310, the perovskite solar cell 320, the first electrode 301, and the second electrode 305.

The connection line 340 serially connects, with one another, a plurality of unit cells configured by the combination of the substrate-type solar cell 310, the perovskite solar cell 320, the first electrode 301, and the second electrode 305.

The connection line 340 electrically connects a first electrode 301 of one unit cell with a second electrode 305 of another unit cell adjacent thereto, and thus, the connection line 340 is provided in a region between unit cells adjacent to each other.

The encapsulation layer 400 is formed on one surface (for example, an upper surface) of the solar cell layer 300. Like the embodiment described above, the encapsulation layer 400 is formed to entirely cover the upper surface of the solar cell layer 300 and is also formed to cover an upper surface of the barrier layer 200 exposed at the outside.

The encapsulation layer 400 may be formed to cover a side surface of a unit cell, and thus, may prevent external water or oxygen from penetrating into the unit cell through the side surface of the unit cell. In detail, the encapsulation layer 400 may be formed to cover a side surface of an outermost unit cell and fill a region between two adjacent unit cells, and thus, may be formed to cover side surfaces of all unit cells.

Therefore, the encapsulation layer 400 is formed to cover a side surface of the substrate-type solar cell 310, and in detail, is formed to cover a side surface of each of the semiconductor substrate 311, the first semiconductor layer 312, the second semiconductor layer 313, the third semiconductor layer 314, the fourth semiconductor layer 315, the first transparent electrode layer 316, and the second transparent electrode layer 317. Also, the encapsulation layer 400 is formed to cover the side surface of the perovskite solar cell 320, and in detail, is formed to cover a side surface of each of the first conductive charge transport layer 302, the light absorption layer 303, and the second conductive charge transport layer 304. Also, the encapsulation layer 400 is formed to contact the connection line 340 provided in a region between two adjacent unit cells.

Although not shown in detail, like the embodiment described above, the encapsulation layer 400 may include a first encapsulation layer 410 and a second encapsulation layer 420, and in this case, the first encapsulation layer 410 may be formed to contact the solar cell layer 300, on the solar cell layer 300, and the second encapsulation layer 420 may be formed on the first encapsulation layer 410 and may not contact the solar cell layer 300. Each of the first encapsulation layer 410 and the second encapsulation layer 420 is formed to fill a region between two unit cells and detailed configurations thereof are the same as the embodiment described above, and thus, repeated descriptions thereof are omitted.

The protection layer 500 is formed on one surface (for example, an upper surface) of the encapsulation layer 400. The protection layer 500 may be formed to entirely cover the upper surface of the encapsulation layer 400.

Figure 5A:
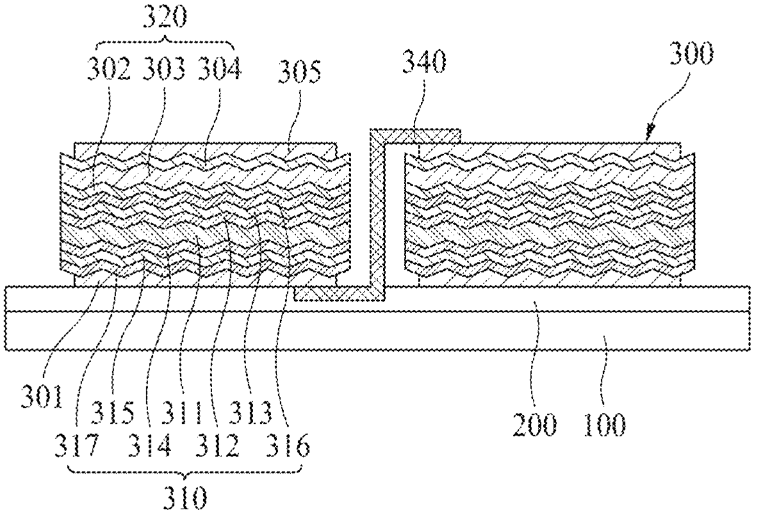
FIGS. 5A to 5C are diagrams of a manufacturing process of a solar cell according to another embodiment of the present inventive concept and relate to a manufacturing method of the solar cell according to FIG. 4 described above.
Figure 5B:
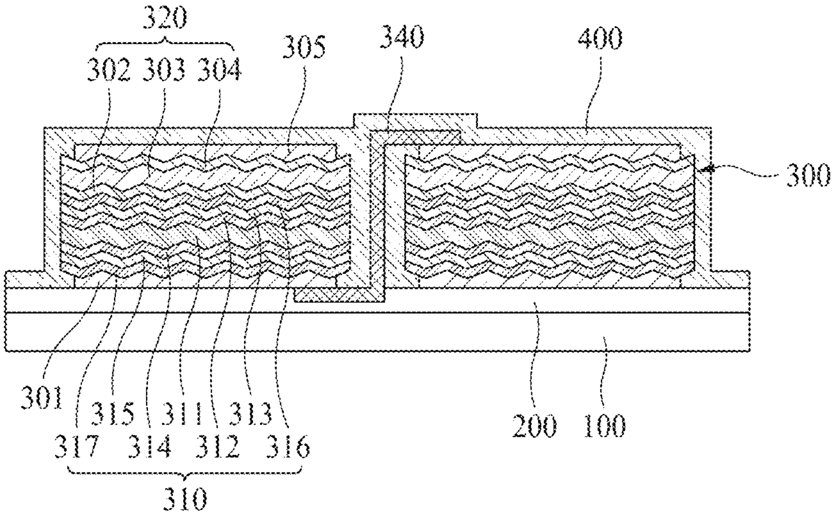
Figure 5C:
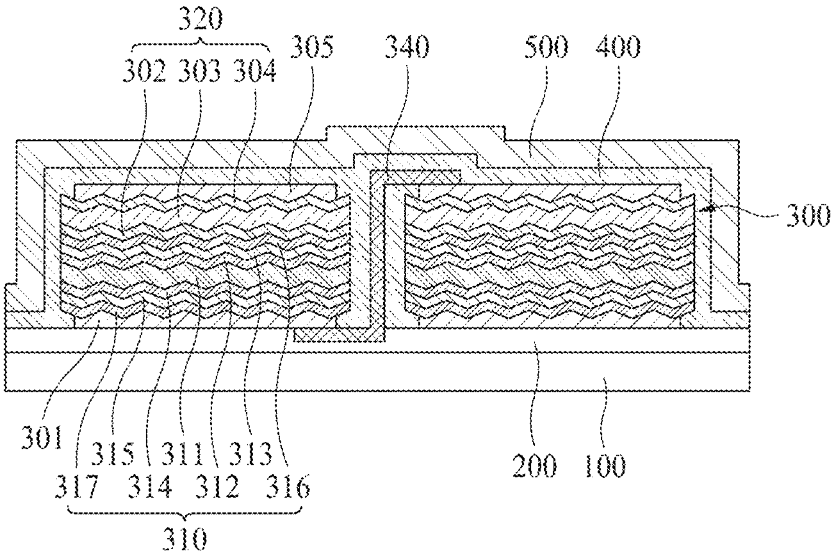

FIGS. 5A to 5C are diagrams of a manufacturing process of a solar cell according to another embodiment of the present inventive concept and relate to a manufacturing method of the solar cell according to FIG. 4 described above. Therefore, a repeated description of the same element is omitted.

First, as seen in FIG. 5A, a barrier layer 200 is formed on one surface (for example, an upper surface) of a substrate 100, and a solar cell layer 300 is formed on one surface (for example, an upper surface) of the barrier layer 200.

The solar cell layer 300 may be formed through a process which forms a substrate-type solar cell 310, forms a perovskite solar cell 320 on the substrate-type solar cell 310, forms a first electrode 301 on a lower surface of the substrate-type solar cell 310, forms a second electrode 305 on an upper surface of the perovskite solar cell 320, and connects a first electrode 301 of one unit cell with a second electrode 305 of one other unit cell with a connection line 340. The solar cell layer 300 formed in this manner may be stacked on the upper surface of the barrier layer 200.

The substrate-type solar cell 310 may be formed through a process which forms a first semiconductor layer 312 on an upper surface of a semiconductor substrate 311, forms a second semiconductor layer 313 on an upper surface of the first semiconductor layer 312, forms a third semiconductor layer 314 on a lower surface of the semiconductor substrate 311, forms a fourth semiconductor layer 315 on a lower surface of the third semiconductor layer 314, forms a first transparent electrode layer 316 on an upper surface of the second semiconductor layer 313, and forms a second transparent electrode layer 317 on a lower surface of the fourth semiconductor layer 315, but is not limited thereto.

The perovskite solar cell 320 may be formed through a process which sequentially forms the first conductive charge transport layer 302, the light absorption layer 303, and the second conductive charge transport layer 304 on the first transparent electrode layer 316.

Subsequently, as seen in FIG. 5B, an encapsulation layer 400 is formed on one surface (for example, an upper surface) of the solar cell layer 300.

Subsequently, as seen in FIG. 5C, a protection layer 500 is formed on one surface (for example, an upper surface) of the encapsulation layer 400.

Figure 6A:
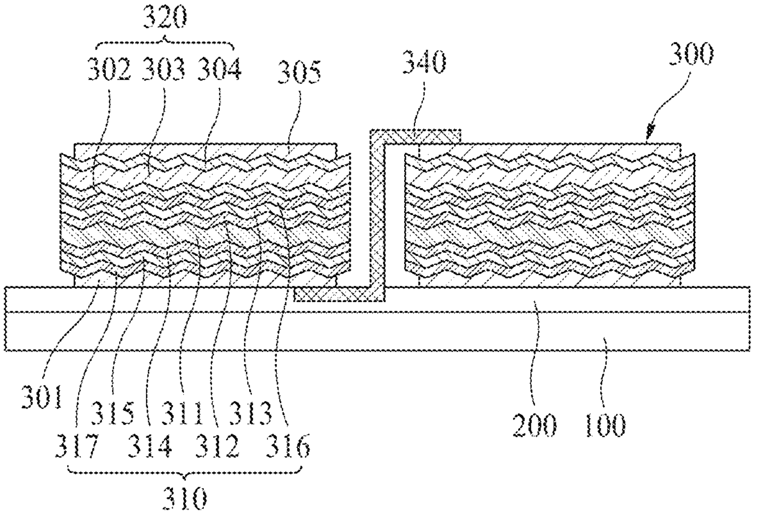
FIGS. 6A to 6C are diagrams of a manufacturing process of a solar cell according to another embodiment of the present inventive concept and relate to the manufacturing method of the solar cell according to FIG. 4 described above.
Figure 6B:
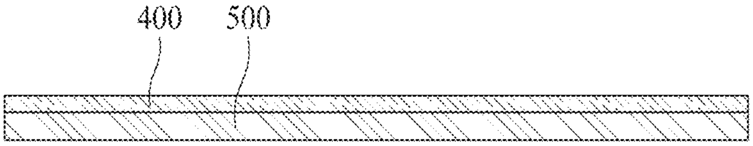
Figure 6C:
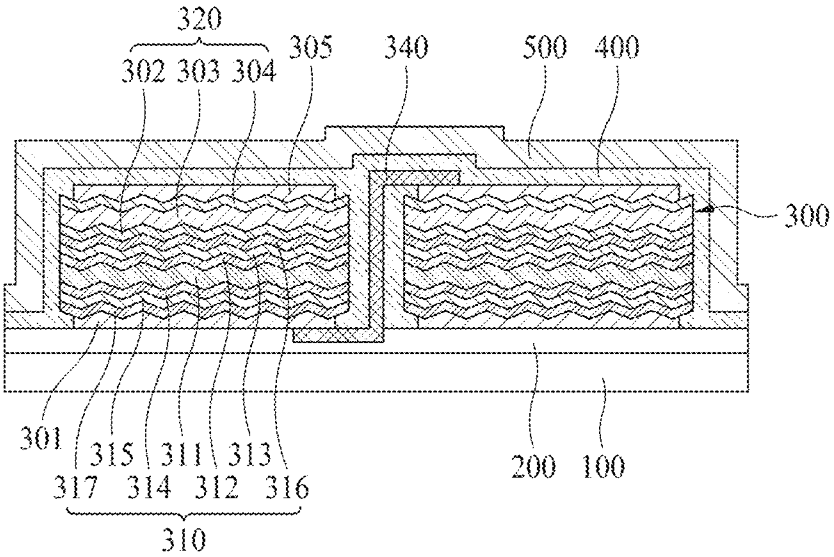

FIGS. 6A to 6C are diagrams of a manufacturing process of a solar cell according to another embodiment of the present inventive concept and relate to the manufacturing method of the solar cell according to FIG. 4 described above. Therefore, a repeated description of the same element is omitted.

First, as seen in FIG. 6A, a barrier layer 200 is formed on one surface (for example, an upper surface) of a substrate 100, and a solar cell layer 300 is formed on one surface (for example, an upper surface) of the barrier layer 200.

A process of FIG. 6A is the same as a process of FIG. 5A described above, and thus, repeated descriptions thereof are omitted.

Subsequently, as seen in FIG. 6B, an encapsulation layer 400 is formed on one surface of the protection layer 500. Although not shown in detail, as in FIG. 3B described above, a second encapsulation layer 420 is formed on one surface of the protection layer 500 and a first encapsulation layer 410 is formed on one surface of the second encapsulation layer 420, thereby forming the encapsulation layer 400 on the one surface of the protection layer 500.

Subsequently, as seen in FIG. 6C, the encapsulation layer 400 and the protection layer 500 are stacked on an upper surface of the solar cell layer 300 through the application of pressure so that the encapsulation layer 400 contacts the solar cell layer 300, and thus, the solar cell illustrated in FIG. 4 is finished.

Figure 7:
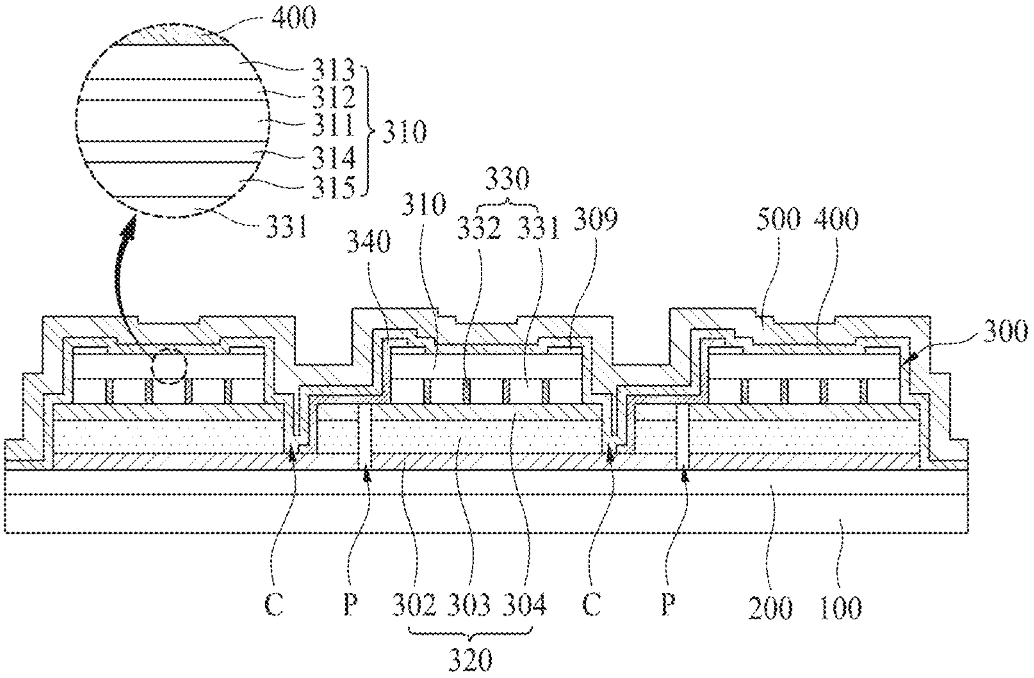
FIG. 7 is a schematic cross-sectional view of a solar cell according to another embodiment of the present inventive concept.

FIG. 7 is a schematic cross-sectional view of a solar cell according to another embodiment of the present inventive concept.

As seen in FIG. 7, the solar cell according to another embodiment of the present inventive concept includes a substrate 100, a barrier layer 200, a solar cell layer 300, an encapsulation layer 400, and a protection layer 500.

The substrate 100 and the barrier layer 200 are as described above, and thus, repeated descriptions thereof are omitted.

The solar cell layer 300 includes a perovskite solar cell 320, a buffer layer 330, a substrate-type solar cell 310, an electrode 309, and a connection line 340.

The perovskite solar cell 320 may be formed through a process which sequentially forms a first conductive charge transport layer 302, a light absorption layer 303, and a second conductive charge transport layer 304, which are sequentially formed on an upper surface of the barrier layer 200.

In this case, a separation portion P may be formed in the perovskite solar cell 320, and thus, a plurality of unit cells may be divided by the separation portion P. In the present embodiment, a unit cell may be configured by a combination of the perovskite solar cell 320, the buffer layer 330, the substrate-type solar cell 310, and the electrode 309.

The separation portion P is formed by removing a certain region of each of the first conductive charge transport layer 302, the light absorption layer 303, and the second conductive charge transport layer 304, which configure the perovskite solar cell 320. The separation portion P may be formed through a primary scribing process, particularly, a laser scribing process. In a region where the separation portion P is formed, the upper surface of the barrier layer 200 is exposed.

Moreover, a contact portion C is formed in the perovskite solar cell 320.

The contact portion C is spaced apart from the separation P. The contact portion C is formed by removing a certain region of each of the light absorption layer 303 and the second conductive charge transport layer 304. The contact portion C is for serially connecting two adjacent unit cells with each other. The contact portion C may be formed through a secondary scribing process, particularly, a laser scribing process. In a region where the contact portion C is formed, the upper surface of the first conductive charge transport layer 302 is exposed.

The buffer layer 330 is formed between the perovskite solar cell 320 and the substrate-type solar cell 310. That is, the buffer layer 330 is formed on an upper surface of the perovskite solar cell 320 and a lower surface of the substrate-type solar cell 310. The buffer layer 330 is individually formed for each unit cell. The buffer layer 330 is formed not to overlap the contact portion C, and thus, the contact portion C is not covered by the buffer layer 330 and is exposed.

The buffer layer 330 includes a film 331 and a conductive layer 332.

The film 331 includes a plurality of holes, and the conductive layer 332 fills the plurality of holes. The film 331 may include an organic polymer compound, but is not limited thereto. The plurality of holes are formed to pass through the film 331, and the conductive layer 332 may also be formed to pass through the film 331. Therefore, the conductive layer 332 may contact an uppermost surface (for example, the second conductive charge transport layer 304) of the perovskite solar cell 320, and moreover, may contact a lowermost surface (for example, a fourth semiconductor layer 315) of the substrate-type solar cell 310. The plurality of holes and the conductive layer 332 may be formed in a lattice structure which extends in a horizontal direction and a vertical direction, in a plan view.

The substrate-type solar cell 310 is formed on one surface (for example, an upper surface) of the buffer layer 330.

The substrate-type solar cell 310 includes a semiconductor substrate 311, a first semiconductor layer 312, a second semiconductor layer 313, a third semiconductor layer 314, and the fourth semiconductor layer 315. Detailed configurations of the first semiconductor layer 312, the second semiconductor layer 313, the third semiconductor layer 314, and the fourth semiconductor layer 315 are the same as the descriptions of FIG. 4, and thus, repeated descriptions thereof are omitted. Furthermore, although not shown, as in FIG. 4 described above, a first transparent electrode layer 316 may be additionally formed on an upper surface of the second semiconductor layer 313, and a second transparent electrode layer 317 may be additionally formed on a lower surface of the fourth semiconductor layer 315.

The electrode 309 is formed on one surface (for example, an upper surface) of the substrate-type solar cell 310. The electrode 309 may be formed with a certain pattern so that sunlight enters an inner portion of a solar cell. In the present embodiment, the first conductive charge transport layer 302 of the perovskite solar cell 320 may function as a lower electrode of a unit cell, and the electrode 309 may function as an upper electrode of the unit cell.

The connection line 340 serially connects, with one another, a plurality of unit cells configured by a combination of the perovskite solar cell 320, the substrate-type solar cell 310, and the electrode 309.

The connection line 340 electrically connects a first conductive charge transport layer 302 of one unit cell with an electrode 309 of another unit cell adjacent thereto, and thus, the connection line 340 is provided in a region between unit cells adjacent to each other.

The encapsulation layer 400 is formed on one surface (for example, an upper surface) of the solar cell layer 300. Like the embodiment described above, the encapsulation layer 400 is formed to entirely cover the upper surface of the solar cell layer 300 and is also formed to cover an upper surface of the barrier layer 200 exposed at the outside.

The encapsulation layer 400 may be formed to cover a side surface of a unit cell, and thus, may prevent external water or oxygen from penetrating into the unit cell through the side surface of the unit cell. In detail, the encapsulation layer 400 may be formed to cover a side surface of an outermost unit cell and fill a region between two adjacent unit cells, and thus, may be formed to cover side surfaces of all unit cells.

Therefore, the encapsulation layer 400 is formed to cover a side surface of the substrate-type solar cell 310, and in detail, is formed to cover a side surface of each of the semiconductor substrate 311, the first semiconductor layer 312, the second semiconductor layer 313, the third semiconductor layer 314, and the fourth semiconductor layer 315. Also, the encapsulation layer 400 is formed to cover the side surface of the perovskite solar cell 320, and in detail, is formed to cover a side surface of each of the first conductive charge transport layer 302, the light absorption layer 303, and the second conductive charge transport layer 304. Also, the encapsulation layer 400 is formed to cover a side surface of the buffer layer 330. Also, the encapsulation layer 400 is formed to contact the connection line 340 provided in a region between two adjacent unit cells. Particularly, the encapsulation layer 400 is formed to fill the contact portion C. Also, the encapsulation layer 400 may be formed to fill the separation portion P.

Although not shown in detail, like the embodiment described above, the encapsulation layer 400 may include a first encapsulation layer 410 and a second encapsulation layer 420, and in this case, the first encapsulation layer 410 may be formed to contact the solar cell layer 300, on the solar cell layer 300, and the second encapsulation layer 420 may be formed on the first encapsulation layer 410 and may not contact the solar cell layer 300. Each of the first encapsulation layer 410 and the second encapsulation layer 420 is formed to fill a region between two unit cells and detailed configurations thereof are the same as the embodiment described above, and thus, repeated descriptions thereof are omitted.

The protection layer 500 is formed on one surface (for example, an upper surface) of the encapsulation layer 400. The protection layer 500 may be formed to entirely cover the upper surface of the encapsulation layer 400.

Figure 8A:
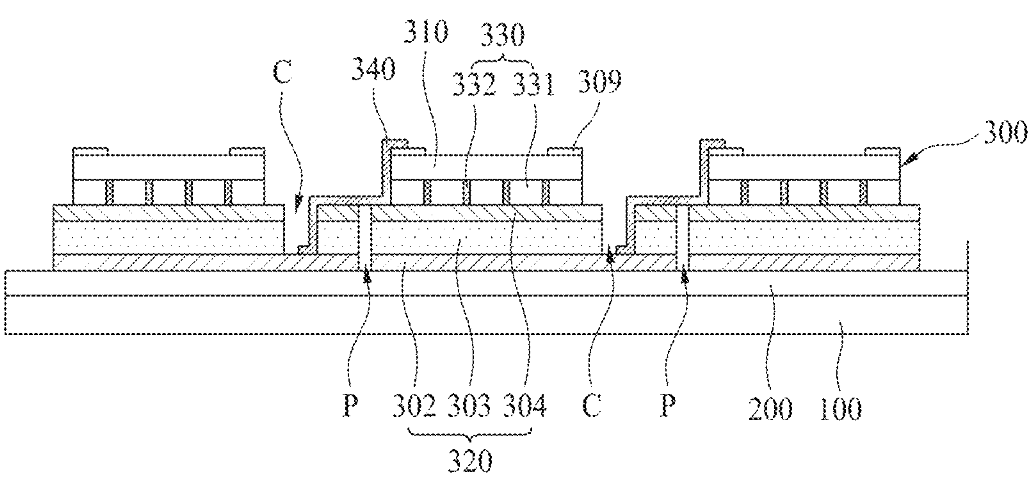
FIGS. 8A to 8C are diagrams of a manufacturing process of a solar cell according to another embodiment of the present inventive concept and relate to a manufacturing method of the solar cell according to FIG. 7 described above.
Figure 8B:
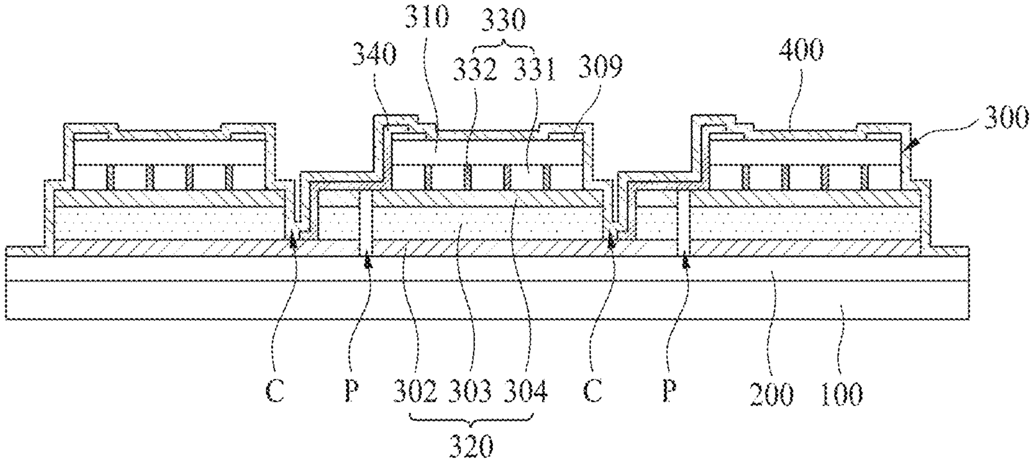
Figure 8C:
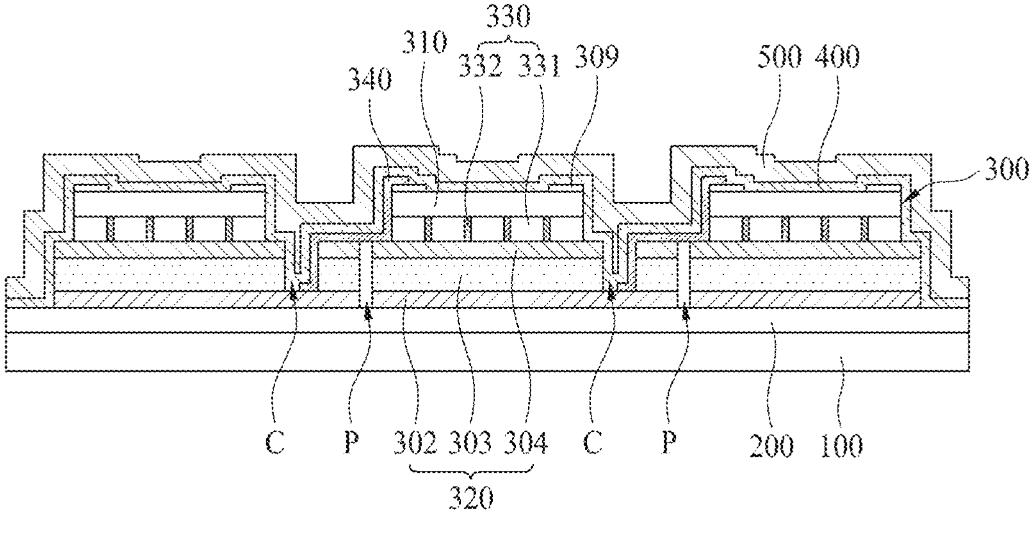

FIGS. 8A to 8C are diagrams of a manufacturing process of a solar cell according to another embodiment of the present inventive concept and relate to a manufacturing method of the solar cell according to FIG. 7 described above. Therefore, a repeated description of the same element is omitted.

First, as seen in FIG. 8A, a barrier layer 200 is formed on one surface (for example, an upper surface) of a substrate 100, and a solar cell layer 300 is formed on one surface (for example, an upper surface) of the barrier layer 200.

The solar cell layer 300 may be formed through a process which forms a perovskite solar cell 320, forms a buffer layer 330 on the perovskite solar cell 320, forms a substrate-type solar cell 310 on the buffer layer 330, forms an electrode 309 on the substrate-type solar cell 310, and connects first conductive charge transport layer 302 of one unit cell with an electrode 309 of one other unit cell with a connection line 340.

The perovskite solar cell 320 may be formed through a process which sequentially forms a first conductive charge transport layer 302, a light absorption layer 303, and a second conductive charge transport layer 304 on the barrier layer 200, forms a separation portion P through a primary scribing process, and forms a contact portion C through a secondary scribing process.

The buffer layer 330 may be formed through a process which forms a film 331, including a plurality of holes, on the perovskite solar cell 320 and fills a conductive layer 332 in the plurality of holes.

The substrate-type solar cell 310 may be formed through a process which forms a first semiconductor layer 312 on an upper surface of a semiconductor substrate 311, forms a second semiconductor layer 313 on an upper surface of the first semiconductor layer 312, forms a third semiconductor layer 314 on a lower surface of the semiconductor substrate 311, and forms a fourth semiconductor layer 315 on a lower surface of the third semiconductor layer 314, and the formed substrate-type solar cell 310 may be stacked on the buffer layer 330.

Subsequently, as seen in FIG. 8B, an encapsulation layer 400 is formed on one surface (for example, an upper surface) of the solar cell layer 300.

Subsequently, as seen in FIG. 8C, a protection layer 500 is formed on one surface (for example, an upper surface) of the encapsulation layer 400.

Figure 9A:
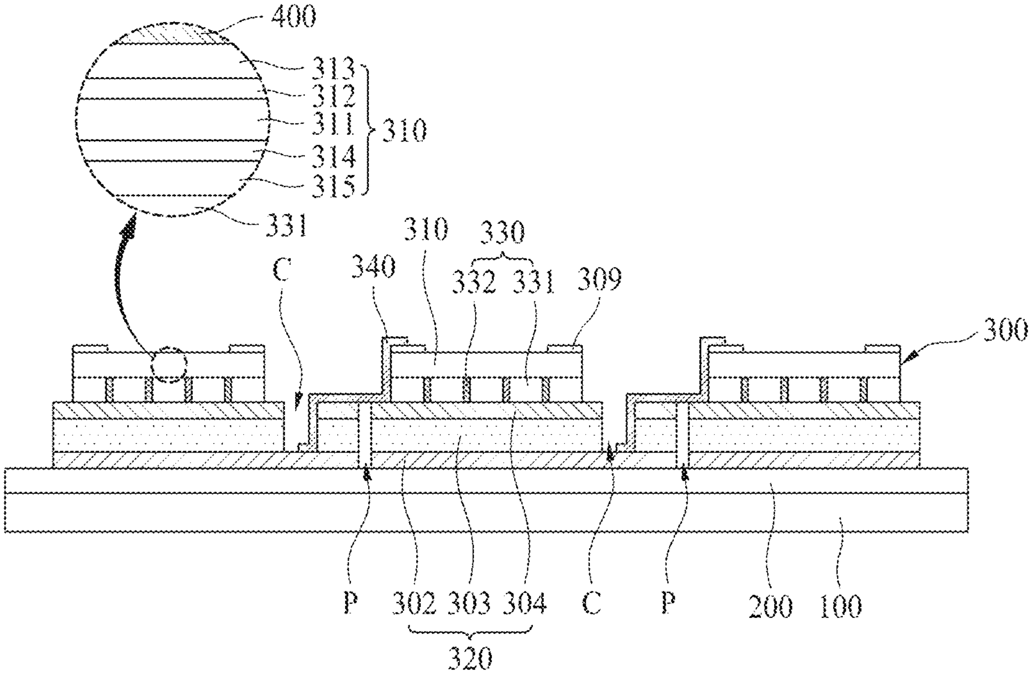
FIGS. 9A to 9C are diagrams of a manufacturing process of a solar cell according to another embodiment of the present inventive concept and relate to the manufacturing method of the solar cell according to FIG. 7 described above.
Figure 9B:
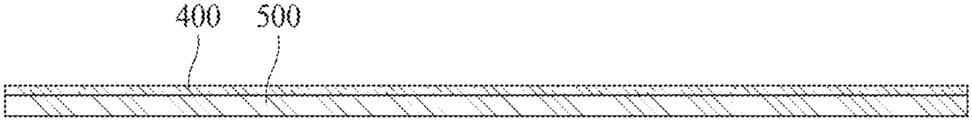
Figure 9C:
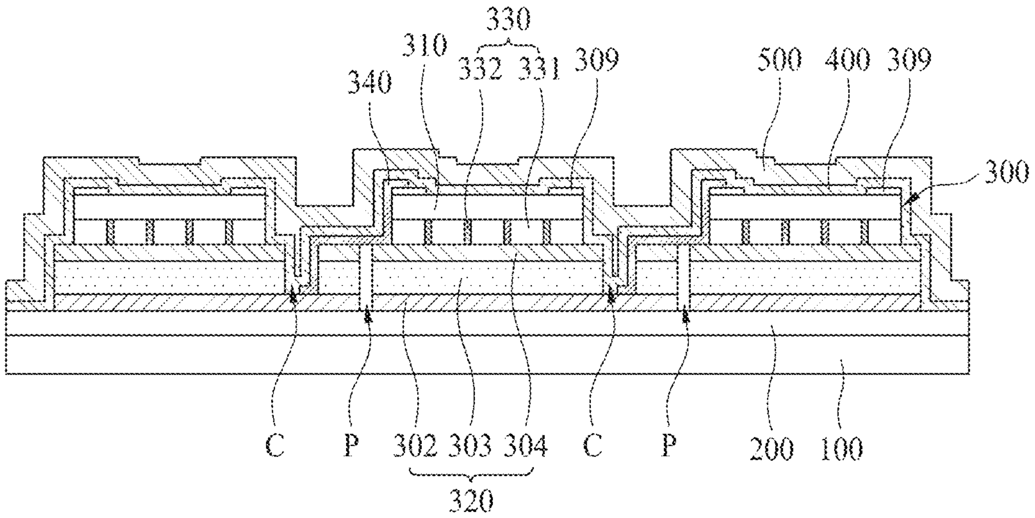

FIGS. 9A to 9C are diagrams of a manufacturing process of a solar cell according to another embodiment of the present inventive concept and relate to the manufacturing method of the solar cell according to FIG. 7 described above. Therefore, a repeated description of the same element is omitted.

First, as seen in FIG. 9A, a barrier layer 200 is formed on one surface (for example, an upper surface) of a substrate 100, and a solar cell layer 300 is formed on one surface (for example, an upper surface) of the barrier layer 200.

A process of FIG. 9A is the same as a process of FIG. 8A described above, and thus, repeated descriptions thereof are omitted.

Subsequently, as seen in FIG. 9B, an encapsulation layer 400 is formed on one surface of the protection layer 500. Although not shown in detail, as in FIG. 3B described above, a second encapsulation layer 420 is formed on one surface of the protection layer 500 and a first encapsulation layer 410 is formed on one surface of the second encapsulation layer 420, thereby forming the encapsulation layer 400 on the one surface of the protection layer 500.

Subsequently, as seen in FIG. 9C, the encapsulation layer 400 and the protection layer 500 are stacked on an upper surface of the solar cell layer 300 through the application of pressure so that the encapsulation layer 400 contacts the solar cell layer 300, and thus, the solar cell illustrated in FIG. 4 is finished.

Hereinabove, the embodiments of the present inventive concept have been described in more detail with reference to the accompanying drawings, but the present inventive concept is not limited to the embodiments and may be variously modified within a range which does not depart from the technical spirit of the present inventive concept. Therefore, it should be understood that the embodiments described above are exemplary from every aspect and are not restrictive. It should be construed that the scope of the present inventive concept is defined by the below-described claims instead of the detailed description, and the meanings and scope of the claims and all variations or modified forms inferred from their equivalent concepts are included in the scope of the present inventive concept.

The invention claimed is:

1. A solar cell comprising:

a solar cell layer provided on a substrate; and an encapsulation layer provided on the solar cell layer, wherein the solar cell layer comprises a plurality of unit cells serially connected with one another, wherein the encapsulation layer comprises metal oxide doped with a dopant material or metal oxynitride doped with a dopant material, wherein the metal oxide or the metal oxynitride comprises at least one metal selected from among a group consisting of W, Nb, and Sn, and wherein the solar cell layer comprises a perovskite solar cell including a contact portion, a buffer layer which is provided on and in direct contact with the perovskite solar cell and includes a film including a plurality of holes and a conductive layer filled into the plurality of holes, a substrate-type solar cell provided on and in direct contact with the buffer layer, an electrode provided on the substrate-type solar cell, and a connection line serially connecting one unit cell with one other unit cell through the contact portion, wherein the encapsulation layer is provided to fill the contact portion.

2. The solar cell of claim 1, wherein the encapsulation layer comprises a first encapsulation layer contacting the solar cell layer and a second encapsulation layer which is formed on the first encapsulation layer and does not contact the solar cell layer, and the metal oxide doped with the dopant material or the metal oxynitride doped with the dopant material is included in the second encapsulation layer, and the first encapsulation layer comprises an insulating material.

3. The solar cell of claim 2, wherein the second encapsulation layer consists of a plurality of layers including different materials.

4. The solar cell of claim 1, wherein the dopant material comprises a material enabling oxide to be formed in the metal oxide or the metal oxynitride, and a refractive index of oxide of the dopant material is lower than a refractive index of the metal oxide or a refractive index of the metal oxynitride.

5. The solar cell of claim 1, further comprising a barrier layer provided between the substrate and the solar cell layer, wherein the encapsulation layer is provided to cover an edge region of the barrier layer which is not covered by the solar cell layer and is exposed.

6. The solar cell of claim 1, wherein a protection layer is further provided on the encapsulation layer.

7. A solar cell comprising:

a solar cell layer provided on a substrate; and an encapsulation layer provided on the solar cell layer, wherein the solar cell layer comprises a plurality of unit cells serially connected with one another, wherein the encapsulation layer comprises a first encapsulation layer contacting the solar cell layer and a second encapsulation layer which is formed on the first encapsulation layer and does not contact the solar cell layer, wherein the first encapsulation layer and the second encapsulation layer are provided to fill a region between two adjacent unit cells, and wherein the solar cell layer comprises a perovskite solar cell including a contact portion, a buffer layer which is provided on and in direct contact the perovskite solar cell and includes a film including a plurality of holes and a conductive layer filled into the plurality of holes, a substrate-type solar cell provided on and in direct contact the buffer layer, an electrode provided on the substrate-type solar cell, and a connection line serially connecting one unit cell with one other unit cell through the contact portion, wherein the first encapsulation layer and the second encapsulation layer are provided to fill the contact portion, and wherein the region between two adjacent unit cells comprises the contact portion.

8. The solar cell of claim 7, wherein the solar cell layer further comprises a plurality of first electrodes spaced apart from each other with a first separation portion therebetween, the perovskite solar cell further comprises a plurality of perovskite solar cells provided on the plurality of first electrodes and spaced apart from each other with a contact portion and a second separation portion therebetween, and a plurality of second electrodes provided on the plurality of perovskite solar cells and connected with the first electrode through the contact portion, wherein the first encapsulation layer and the second encapsulation layer are provided to fill an inner portion of the second separation portion, and wherein the region between two adjacent unit cells further comprises the inner portion of the second separation portion.

9. The solar cell of claim 7, wherein the solar cell layer comprises a first electrode provided on a lower surface of the substrate-type solar cell, a second electrode provided on an upper surface of the perovskite solar cell, and the connection line connecting the first electrode of one unit cell with the second electrode of one other unit cell.

10. The solar cell of claim 7, further comprising a barrier layer provided between the substrate and the solar cell layer, wherein the encapsulation layer is provided to cover an edge region of the barrier layer which is not covered by the solar cell layer and is exposed.

11. The solar cell of claim 7, wherein a protection layer is further provided on the encapsulation layer.

12. A method of manufacturing a solar cell, the method comprising:

a process of forming a solar cell layer on a substrate;

a process of forming an encapsulation layer on the solar cell layer; and a process of forming a protection layer on the encapsulation layer, wherein the solar cell layer comprises a plurality of unit cells serially connected with one another, wherein the encapsulation layer comprises metal oxide doped with a dopant material or metal oxynitride doped with a dopant material, wherein the metal oxide or the metal oxynitride comprises at least one metal selected from among a group consisting of W, Nb, and Sn, and wherein the solar cell layer comprises a perovskite solar cell including a contact portion, a buffer layer which is provided on and in direct contact the perovskite solar cell and includes a film including a plurality of holes and a conductive layer filled into the plurality of holes, a substrate-type solar cell provided on and in direct contact the buffer layer, an electrode provided on the substrate-type solar cell, and a connection line serially connecting one unit cell with one other unit cell through the contact portion, wherein the encapsulation layer is provided to fill the contact portion.

13. The method of claim 12, wherein the encapsulation layer comprises a first encapsulation layer contacting the solar cell layer and a second encapsulation layer which is formed on the first encapsulation layer and does not contact the solar cell layer, and the metal oxide doped with the dopant material or the metal oxynitride doped with the dopant material is included in the second encapsulation layer, and the first encapsulation layer comprises an insulating material.

14. The method of claim 12, wherein the dopant material comprises a material enabling oxide to be formed in the metal oxide or the metal oxynitride, and a refractive index of oxide of the dopant material is lower than a refractive index of the metal oxide or a refractive index of the metal oxynitride.

15. A method of manufacturing a solar cell, the method comprising:

a process of forming a solar cell layer on a substrate;

a process of forming an encapsulation layer on one surface of a protection layer; and a process of stacking the encapsulation layer and the protection layer on one surface of the solar cell layer through application of pressure so that the encapsulation layer contacts the solar cell layer, wherein the solar cell layer comprises a plurality of unit cells serially connected with one another, wherein the encapsulation layer comprises metal oxide doped with a dopant material or metal oxynitride doped with a dopant material, wherein the metal oxide or the metal oxynitride comprises at least one metal selected from among a group consisting of W, Nb, and Sn, and wherein the solar cell layer comprises a perovskite solar cell including a contact portion, a buffer layer which is provided on and in direct contact the perovskite solar cell and includes a film including a plurality of holes and a conductive layer filled into the plurality of holes, a substrate-type solar cell provided on and in direct contact the buffer layer, an electrode provided on the substrate-type solar cell, and a connection line serially connecting one unit cell with one other unit cell through the contact portion, wherein the encapsulation layer is provided to fill the contact portion.

16. The method of claim 15, wherein the encapsulation layer comprises a first encapsulation layer contacting the solar cell layer and a second encapsulation layer which is formed on the first encapsulation layer and does not contact the solar cell layer, and the metal oxide doped with the dopant material or the metal oxynitride doped with the dopant material is included in the second encapsulation layer, and the first encapsulation layer comprises an insulating material.

17. The method of claim 15, wherein the dopant material comprises a material enabling oxide to be formed in the metal oxide or the metal oxynitride, and a refractive index of oxide of the dopant material is lower than a refractive index of the metal oxide or a refractive index of the metal oxynitride.

* * * * *